Figure 1:
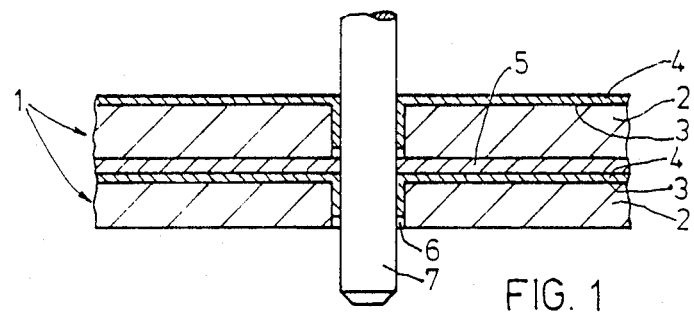

United States Patent [19]

Fahner et al.

[11] Patent Number: 4,748,068

[45] Date of Patent: May 31, 1988

[54] SYNTHETIC RESIN UNIT

[75] Inventors: Karsten Fahner, Winnenden; Hans W. Depcik, Duesseldorf, both of Fed. Rep. of Germany

[73] Assignee: Bayer Aktiengesellschaft, Fed. Rep. of Germany

[21] Appl. No.: 863,349

[22] Filed: May 15, 1986

[30] Foreign Application Priority Data

May 25, 1985 [DE] Fed. Rep. of Germany ....... 3518975

[51] Int. Cl.⁴ .................. B32B 3/00; B32B 27/36; H05K 1/00; C04B 35/00
[52] U.S. Cl. .................... 428/201; 428/901; 428/412; 174/68.5; 264/104
[58] Field of Search ............... 428/209, 901, 412, 201; 174/68.5; 361/401; 29/832, 848; 264/104

[56] References Cited

U.S. PATENT DOCUMENTS

| | | | |
|---|---|---|---|
| 4,295,183 | 10/1981 | Miersch et al. | 361/403 |
| 4,402,135 | 9/1983 | Schueingrubar et al. | 29/832 |
| 4,403,107 | 9/1983 | Hoffman | 174/68.5 |
| 4,433,009 | 2/1984 | Henze et al. | 427/97 |
| 4,604,799 | 8/1986 | Gurol | 29/897 |
| 4,614,837 | 9/1986 | Kane et al. | 174/68.5 |

FOREIGN PATENT DOCUMENTS 268304  4/1964  Australia ............... 428/901

OTHER PUBLICATIONS

Western Electric, Tech Digest No. 15, Jul. 1969, Mayer pp. 15–16.

Primary Examiner—John E. Kittle
Assistant Examiner—Patrick J. Ryan
Attorney, Agent, or Firm—Connolly and Hutz

[57] ABSTRACT

An injection molded synthetic resin unit (2) is provided along predetermined paths (4) with another electrically conductive injection molded synthetic resin to produce, for example, a printed circuit board (1).

7 Claims, 1 Drawing Sheet

SYNTHETIC RESIN UNIT

This invention relates to a synthetic resin unit with electric current paths, in particular printed circuit boards, consisting of insulating and conductive materials, and a process for manufacturing the same.

Printed circuit boards of Pertinax are known in which electronic elements are pushed with their wire ends from one side of the board to the other through bores and at least partly interconnected on the other side by means of a conductive system of thin metal coatings. The contact between the wire end and the conductive system is established by soldering either in a hot soldering bath or by the vapour phase soldering process.

The disadvantage of printed circuit boards is that the application of conductive tracks by electroplating, the drilling of bores for the electronic elements and the subsequent soldering are very expensive.

Furthermore, faults may arise due to cold soldering and the electronic elements may be damaged by the action of heat, and these faults may in part remain unnoticed until the circuit board is put into operation. Cracks may also form in the board, resulting in undesirably high contact resistances.

It is an object of the present invention to provide an inexpensively producible synthetic resin unit with current paths which can be fitted with other electric elements by means of safe and reliable contacts without the use of heat or tools and in which the current paths may, if desired, only be indirectly accessible.

To solve this problem according to the invention, a moulded unit of an insulating synthetic resin is provided with recesses and/or perforations which at least in part have a conductive synthetic resin arranged in their vicinity to serve as current path.

The moulded unit, which may be in the form of a board or a 3-dimensional body, serves as a support and an insulator for the electric system of conductive synthetic resin. This system consists of current paths situated mainly in recesses extending parallel to the surface of one or both sides and optionally reinforcements arranged mainly in the perforations and recesses which extend transversely to the surface.

The electronic elements may be arranged on one or both sides, and control of the arrangement is greatly facilitated by using a transparent synthetic resin.

The components may be pushed with their contact pins directly into the reinforcements in the conductive synthetic resin, whereby the components can be firmly secured and perfect electric contact can be maintained even over a long service life. The risk of corrosion due to access of air or due to cracks is only slight if an elastic synthetic resin is used, particularly for the conductive system. Instead of using contact pins, the components may be designed to be glued into position. Such components are known as "leadless" components, which are characterised by their electrically conductive adhesive connections.

In one particular embodiment, the conductivity of the conductive synthetic resin is greater than 0.01 S/cm.

All conductive synthetic resins which have a conductivity of 0.25–0.02 S/cm are particularly suitable as they enable the necessary currents to be conducted within a design of suitable dimensions for practical purposes and without significant voltage losses.

The following are examples of suitable conductive synthetic resins:

| | |
|---|---|
| Liquid silicone rubber (LSR) | 10 Ω cm. |
| Polyacetylene (PAC) | |
| Iron (III) Chloride in CH$_3$CN | 19.23 Ω cm |
| Titanium (IV) chloride in CH$_2$Cl$_2$ | 3.95 Ω cm |
| Tin (IV) chloride in CH$_2$Cl$_2$ | 3.7 Ω cm |
| Polyethylene/ethylene-vinylacetate rubber (PE/EVM) | 35 Ω cm |
| Polypropylene-carbon black | 100 Ω cm |
| Polycarbonate film | 1 Ω cm |

In another embodiment, at least one of the synthetic resins is an injection moulded thermoplast.

For mass produced articles, it is particularly economical to produce one or both synthetic resins by injection moulding in order to obtain inexpensive products.

In another embodiment, the recesses, which are in most cases elongated, have a depth of 0.2–4 mm, in particular 0.8–2 mm.

Although the cross section should be sufficiently large in order to avoid high voltage losses, the board should not be too thick. To satisfy these requirements, it has been found particularly advantageous to provide recesses having a depth of 0.8 to 2 mm; a width of 0.5 to 4 mm is generally sufficient. The conductive synthetic resin may fill the recesses either partly or completely. One could conceivably also provide current paths in which the conductive synthetic resin projects from the surface in order to increase the conductive cross sectional area.

In one possible embodiment, the perforations are in the form of bores which are only partly filled with conductive synthetic resin.

The geometrical contour of that part of the performation which is not filled with conductive synthetic resin may be suitably designed to facilitate the introduction of the contact pins and possibly also prevent accidental removal of the pins, for example by the formation of a barb.

In one embodiment, an insulating protective layer is provided to cover at least the conductive synthetic resin.

A synthetic resin unit which is protected against corrosion and short circuiting may be obtained by applying a third layer, the outer contact pins being then pushed through the insulating protective layer. Parts of this kind are particularly advantageous, for example, for car lights which come into contact with moisture. A shielding effect can be produced by applying additional conductive layers.

It would also be possible to arrange a desired number of circuit boards one above the other and connect them together, for example, by contact pins, only where the circuit diagram requires this. A compact, comprehensive conductive system may thereby be built up.

The problem of producing a synthetic resin unit having electric current paths is solved by injection moulding one of the components from a conductive synthetic resin to form at least one current path.

For mass produced articles, the conductive synthetic resin enables a printed circuit board, for example, to be produced in a single process step merely by applying the conductive material to the surface of the insulating synthetic resin. The contacts may be glued into position in such a manner as to be electrically conductive or, if the board is thick enough, they may be pushed in.

In one embodiment, the condutive synthetic resin used as current path is injected at least partly into the recesses or perforations of a moulded unit of insulating synthetic resin produced by injection moulding.

The process is very economical since it enables several components produced in different injection moulding apparatus to be successively moulded together after transfer of each component to the next apparatus to form a uniform moulded unit. A complicated synthetic resin unit carrying electric current paths and if necessary also protective layers against water or leakage fields can thus be produced in a single operational step.

Figure 2:
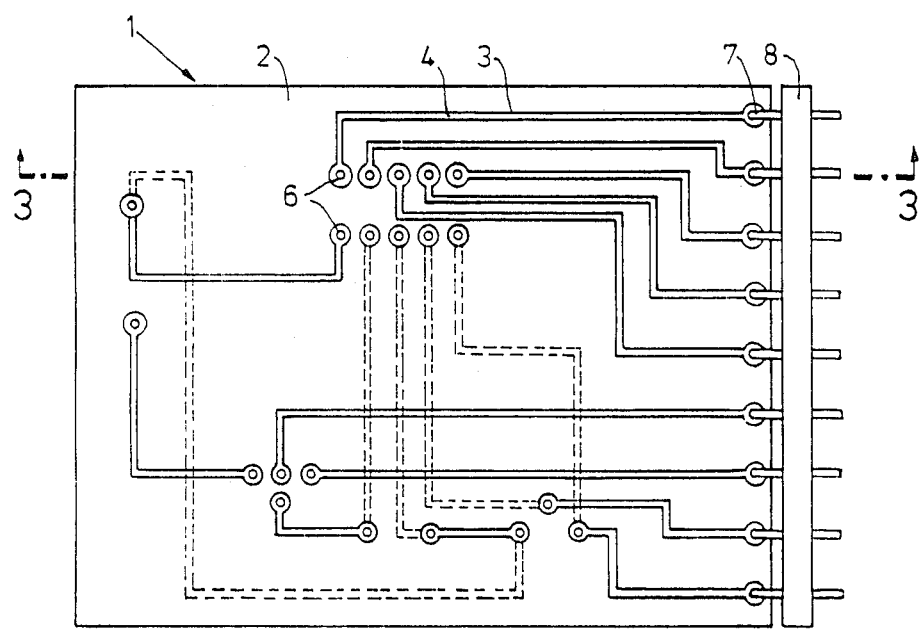
Figure 3:
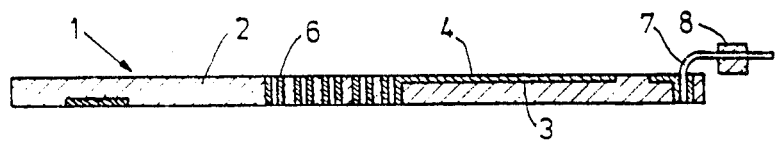

Examples of the invention are described below with reference to the drawings, in which FIG. 1 is a cross section through a stack of printed circuit boards, FIG. 2 is a top plan view of a circuit board and FIG. 3 is a longitudinal section through the board.

FIG. 1 shows a cross section through several circuit boards 1 of synthetic resin in which a moulded unit 2 of insulating synthetic resin has recesses 3 into which a conductive synthetic resin is injected as a current path 4. A layer 5 of insulating synthetic resin is then moulded over the arrangement, and this layer contains another moulded unit 2 with a current path 4. A contact pin 7 is inserted through an opening in the form of a continuous bore 6.

FIGS. 2 and 3 show a circuit board 1 in which a moulded unit 2 has recesses 3 on the upper and under side to receive the current paths 4 of conductive synthetic resin. In addition, the board has a large number of perforations 6, some of which have contacts passing right through them, i.e. the current paths 4 on the underside are connected with the current paths 4 on the upperside. Contact pins 7 from a plug strip 8 are inserted in the openings 6 at the right hand edge of the moulded unit.

The moulded unit has been injection moulded from polycarbonate (Makrolon ® Type 2800) and has a wall thickness of 2 mm. The current paths 4 of conductive synthetic resin were formed by injection moulding liquid silicone rubber (LSR 3177/156) with a resistance $R_o = 10 \, \Omega$ cm. and a wall thickness of 8.0 mm.

We claim:

1. A synthetic resin unit with electric current paths, in particular a printed circuit board, consisting of insulating and conductive materials, comprising a moulded unit of insulating synthetic resin having
    recesses and/or perforations in the region of at least some of which is arranged a conductive synthetic resin as a current path and wherein the conductivity of the conductive synthetic resin is greater than 0.01 S/cm.

2. A synthetic resin unit according to claim 1, characterised in that at least one of the synthetic resins is an injection moulded thermoplast.

3. A synthetic resin unit according to claim 1, characterised in that the recesses have a depth of 0.2–4 mm.

4. A synthetic resin unit according to claim 1, characterised in that the perforations are bores which are only partly filled with conductive synthetic resin.

5. A synthetic resin unit according to claim 1, characterised in that at least the conductive synthetic resin is covered by a protective layer.

6. A synthetic resin unit with electric current paths, in particular a printed circuit board, consisting of insulating and conductive materials, characterised in that a moulded unit of insulating synthetic resin has recesses and/or perforations in the region of at least some of which is arranged a conductive synthetic resin as a current path, and wherein the insulating synthetic resin is polycarbonate and the conductive synthetic resin is liquid silicon rubber.

7. A synthetic resin unit according to claim 3, characterized in that the recesses have a depth of 0.8–2 mm.

* * * * *